(12) United States Patent
Kao et al.

(10) Patent No.: US 7,865,850 B1
(45) Date of Patent: Jan. 4, 2011

(54) METHOD AND APPARATUS FOR SUBSTRATE NOISE AWARE FLOOR PLANNING FOR INTEGRATED CIRCUIT DESIGN

(75) Inventors: William Kao, Fremont, CA (US); Xiaopeng Dong, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 249 days.

(21) Appl. No.: 12/037,843

(22) Filed: Feb. 26, 2008

Related U.S. Application Data

(60) Provisional application No. 60/892,204, filed on Feb. 28, 2007.

(51) Int. Cl.
*G06F 17/50* (2006.01)

(52) U.S. Cl. .............. 716/4; 716/5; 716/8; 716/10; 703/14; 703/15

(58) Field of Classification Search .............. 716/1, 716/4, 8, 10, 19–21; 703/13, 14, 15
See application file for complete search history.

(56) References Cited

U.S. PATENT DOCUMENTS

| | | | |
|---|---|---|---|
| 5,459,349 A | 10/1995 | Kobatake | |
| 7,024,652 B1 | 4/2006 | McGaughy et al. | |
| 7,047,510 B1 | 5/2006 | Chopra et al. | |
| 7,243,323 B2 | 7/2007 | Williams et al. | |
| 2002/0095648 A1* | 7/2002 | Saito | 716/10 |
| 2002/0164851 A1* | 11/2002 | Wu et al. | 438/215 |
| 2003/0177427 A1* | 9/2003 | Fattouh et al. | 714/741 |
| 2004/0187085 A1* | 9/2004 | Sinha et al. | 716/4 |
| 2005/0257077 A1 | 11/2005 | Dutta et al. | |
| 2006/0184904 A1 | 8/2006 | Murgai et al. | |
| 2007/0067747 A1* | 3/2007 | Checka et al. | 716/5 |
| 2007/0156379 A1 | 7/2007 | Kulkarni | |
| 2007/0288219 A1 | 12/2007 | Zafar et al. | |
| 2008/0072182 A1 | 3/2008 | He et al. | |
| 2008/0093560 A1 | 4/2008 | Puhakka et al. | |
| 2009/0006065 A1 | 1/2009 | Kariat et al. | |
| 2009/0007032 A1 | 1/2009 | Kariat et al. | |
| 2009/0234630 A1* | 9/2009 | Clement | 703/14 |

FOREIGN PATENT DOCUMENTS

WO    WO 2007/012787    *    2/2007

OTHER PUBLICATIONS

Kao, William H. et al., "Digital Block Modeling and Substrate Noise Aware Floorplanning for Mixed Signal SOCs,". IEEE International Symposium on Circuits and Systems, May 27-30, 2007, pp. 1935-1938.

(Continued)

*Primary Examiner*—Paul Dinh
*Assistant Examiner*—Nha T Nguyen
(74) *Attorney, Agent, or Firm*—Schwegman, Lundberg & Woessner, P.A.

(57) ABSTRACT

A methodology is provided to perform noise analysis in the implementation stage of the design of an integrated circuit, and based upon analysis results, a floorplan may be adjusted or guard rings may be inserted to reduce the impact of digital switching noise upon noise sensitive circuits.

14 Claims, 11 Drawing Sheets

OTHER PUBLICATIONS

Mayaram, Karti, et al., "Modeling and Analysis for Substrate Noise Mitigation in High Frequency Integrated Circuits," catalog page and statement of overview of research, Oregon State University, Corvallis, Oregon, ca. 2006.

Koukab, Adil, et al., "Modeling Techniques and Verification Methodologies for Substrate Coupling Effects in Mixed-Signal System-on-Chip Designs," IEEE Transactions on Computer-Aided Design of Integrated Circuits and Systems, vol. 23, No. 6, Jun. 2004, pp. 823-836.

Clément, François, "Signal integrity analysis in wireless SoCs," Design Line, United Business Media LLC, Manhasset, New York, May 14, 2007.

Gharpurey, Ranjit, et al., "Substrate Coupling: Modeling, Simulation and Design Perspectives," IEEE 5th International Symposium on Quality Electronic Design, Mar. 22, 2004, pp. 283-290.

EN.WIKIPEDIA.ORG, "Signal Integrity," online article.

Bearden, D, et al., "Design and Analysis of Power Distribution networks in PowerPC Microprocessors", (1998), 6 pgs.

Blaauw, D, et al., "Design and Analysis of Power Supply Networks", Chapter 20 of 'EDA for IC Implementation, Circuit Design, and Process Technology' published by CRC Press, Taylor & Francis Group, (2006), 20-1 through 20-14.

Checka, N, "Substrate Noise Analysis and Techniques for Mitigation in Mixed-Signal RF Systems", MIT, (2005), 158 pgs.

Cho, M, et al., "Fast Substrate Noise-Aware Floorplanning with Preference Directed Graph for Mixed-Signal SOCs", Proceedings of the 2006 conference on Asia South Pacific design automation, 765-770.

Chu, W, et al., "Noise Constraint Driven Placement for Mixed Signal Designs", Proceedings of the 2003 International Symposium on Circuits and Systems, vol. 4 Issue 25-28 May 2003, IV-712-IV-715.

Hashimoto, T, et al., "LSI Noise Model for Power Integrity Analysis and Its Application", Fujitsu Sci. Tech. J. 42.2, 266-273, Apr. 2006.

Iwata, A, et al., "Substrate Crosstalk Analysis in Mixed Signal CMOS Integrated Circuits", Design Automation Conference, 2000, Proceedings of the ASP-DAC 2000. Asia and South Pacific Volume, Issue, 2000, 623-629.

* cited by examiner

METHOD AND APPARATUS FOR SUBSTRATE NOISE AWARE FLOOR PLANNING FOR INTEGRATED CIRCUIT DESIGN

CROSS REFERENCE TO RELATED APPLICATION

The subject matter of this application claims priority to commonly-owned U.S. Provisional Patent Application Ser. No. 60/892,204 entitled DIGITAL BLOCK MODELING AND METHOD AND APPARATUS FOR SUBSTRATE NOISE AWARE FLOOR PLANNING FOR MIXED SIGNAL SOCs, filed on Feb. 28, 2007, which is expressly incorporated herein by this reference.

BACKGROUND OF THE INVENTION

1. Field of the Invention

The invention relates in general to floorplanning during design of integrated circuits and more particularly, to use of estimated substrate noise as a constraint during floorplanning.

2. Description of the Related Art

With the increasing levels of integration in chip design, more SOCs are being developed that have digital, analog and RF functions integrated on a single chip substrate. Furthermore, in the deep submicron regime signal integrity issues are increasingly becoming more critical. One of the most significant signal integrity problems in mixed signal designs today is the handling of noise coupled through the common substrate caused by power supply fluctuations due to simultaneous switching of digital cells. See, S. Ponnapalli, N. Verghese, W. K. Chu and G. Coram," Preventing a Noisequake: Substrate analysis identifies Potential problems in Mixed Signal and RF designs," IEEE Circuits and Devices, Vol. 17, No. 6, November 2001, pp. 19-28; and M. Heijningen, M. Badaroglu, S. Donnay, M. Engels and I. Bolsens, "High-level simulation of substrate noise generation including power supply noise coupling," Proc. of IEEE DAC, pp. 738-743, Los Angeles, Calif. June 2000. The main sources of noise injection to the substrate are noise due to digital switching including noise on the ground contacts and on $V_{DD}$ contacts due to switching transients. Researchers have further extended substrate-coupling analysis to floorplanning and placement domains. See, S. Mitra, R. A. Rutenbar, L. R. Carley and D. J. Allstot, "Substrate-Aware Mixed-Signal Macro-Cell Placement in WRIGHT," Proc. IEEE Customer Integrated Circuits Conf, May 1994, pp. 24.2.1-24.2.4; S. Zhao, K. Roy and C. K. Koh, "Decoupling Capacitance Allocation and Its Application to Power-Supply Noise-Aware Floorplanning," IEEE Trans. Computer-Aided Design, vol. 21, no. 1, January 2002, pp. 81-92; and W. Kao and W. K. Chu, "Noise constraint driven placement for Mixed Signal Designs," 2003 International Symposium Circuits and Systems, Bangkok, Thailand, May 25-28, 2003, pp. 712-715.

FIG. 1 is an illustrative perspective view of a mixed-signal integrated circuit that includes a digital subsystem and an analog subsystem and that also includes a cross-section view of the IC substrate. The digital and analog subsystems are physically separated in different circuit blocks. Even though the digital and analog blocks of the integrated circuit (IC) may be separated by relatively large distances, they are nevertheless electrically coupled through a shared substrate. The substrate is a conductive medium vulnerable to a phenomenon called "substrate noise" or "substrate coupling". Substrate noise can result in un-intended interaction between the digital and analog components of a chip through the underlying silicon substrate. Analog systems generally lack the degree of noise immunity of digital circuits, and the substrate coupling noise can degrade analog performance.

Digital circuits typically operate with two discrete voltages, one corresponding to logic 0 and another corresponding to logic 1. Usually, the logic 1 value is encoded as the power supply voltage (or $V_{DD}$), and logic 0 is encoded as the ground voltage (or 0, or $V_{SS}$) in CMOS digital chips. During circuit operation, the signals on the digital portion switch from logic 1 to logic 0 or vice versa. In other words, the voltage on the signal line changes from one extreme allowed voltage to the other.

Analog circuits usually operate with voltage values that represent continuous analog behavior rather than switch between discrete voltages. Analog circuit examples include oscillators, Analog-to-Digital and Digital-to-Analog converters, mixers, amplifiers. Analog circuits typically operate with signals that are significantly smaller in amplitude than digital signals. Analog circuits are, therefore, generally more sensitive to effects of substrate noise than are digital circuits.

Substrate noise can cause fluctuations in the voltage potential of the substrate, which can affect CMOS device behavior. For example, it can change the threshold voltage of a CMOS transistor. For a digital circuit, this could result in a small change in the delay of a logic gate. However, for an analog circuit, the effect can be much more severe. For instance, in an amplifier, a change in threshold voltage can change the operating point of the amplifier and significantly reduce the gain. In a filter, it can reduce the noise margin.

Digital circuit switching generates substrate noise through multiple mechanisms. For instance, digital circuit switching results in substrate noise injection to the substrate from the junction of a digitally switching transistor. Also, digital circuit switching results in substrate noise injection due to power supply fluctuations. More noise ordinarily will be injected to the substrate from areas of the IC with a higher density of digital transistors. The power supply rails of an IC are tied at periodic intervals to the substrate using electrical contacts. This ensures that the substrate is kept at a desired potential. Especially in the digital circuit blocks of the chip, significant current is drawn on the power supply rails, and the power supply voltage fluctuates as a function of the switching activity. This voltage fluctuation is imparted to the substrate through the electrical contacts, and gets propagated through the substrate, eventually reaching the analog circuit blocks of the chip. The imparted voltage fluctuations constitute substrate noise. The variation in power supply voltages, and resultant substrate noise, can be exacerbated by inductance of the power supply lines bringing power to the chip, as well as by on-chip inductances.

In a CMOS circuit, electrical contacts comprise n+ and p+ diffusion regions adjacent NMOS or PMOS devices that are used to set the bulk terminal of the device to either ground or $V_{DD}$ depending on device type. When a digital signal transition occurs, a spike of current from the power supply is used to charge the output load. A significant portion of the current is discharged to ground, which the substrate ultimately connects to. In general, noise injection from the power supply fluctuation is a more significant substrate noise source than noise injection from switching transistors.

These discharge currents work in tandem with the parasitics of the power and ground lines to cause ringing in the supplies. However, since the substrate is connected to power and ground through low resistance substrate contacts, any such noise that appears on the power and ground lines appears also directly in the substrate. Once the noise has been injected into the substrate, it can propagate throughout the substrate. Although noise may be attenuated by the resistance of the substrate, it still can reach all areas of the chip. Substrate voltage fluctuations that reach analog transistors can have a detrimental impact upon their operation as described above.

In general terms, a floorplan comprises a data structure that captures the relative positions of objects in a circuit design rather than the actual co-ordinates of their locations in a design. Once a floorpan has been developed, optimization processes can be used to convert objects within the floorplan to geometrical circuit elements at co-ordinate locations. Creation of an initial floorplan ordinarily is performed early in an integrated circuit design flow since the relative locations of objects within a floorplan can influence other processes in the overall design flow. The objects that have their relative positions determined in a floorplan typically represent larger functional units of the design such as Random Access Memory (RAM), Content Addressable Memory (CAM), register arrays, large clock buffers, DC caps and analog circuits such as phase lock loops. Developing a floorplan also may involve creation of portions of a clock distribution network and placing I/O cells and pads, for example. Relative positioning of objects in a floorplan typically is constrained by factors such as preliminary shapes of the objects, an incidence structure (i.e., a netlist) a preliminary environment (e.g., pin positions), timing information for external signals, path delay information and module delay information. These constraints may be applied recursively to develop the floorplan. For example, under one set of constraints, the degree of interconnectivity between objects and their participation in critical paths may have a significant impact upon their relative positions in a floorplan, e.g., two objects that have timing-critical connections are likely to be positioned relatively closer together.

In the past, accurate substrate noise estimates generally were not easily available for use in developing a floorplan early in an integrated circuit design flow. Substrate noise analysis typically involved detailed extraction of the geometries of IC structures such as, wells, contacts, well taps, diffusions and trenches from a design in the form of a resistive or RC network. However, these design details often are not readily available until later in the design flow, and even when available, detailed extraction can be quite expensive in terms of run time and memory requirements.

Thus, there has been a need for improvements in the use of substrate noise estimates as a guide to development of an initial floorplan early in an integrated circuit design flow. The present invention meets this need.

SUMMARY OF THE INVENTION

In one aspect, a method is provided to develop a substrate noise aware floorplan for an integrated circuit design that includes first circuit blocks that act as substrate noise sources (i.e., 'aggressor' blocks) and second circuit blocks that are sensitive to substrate noise (i.e., 'victim' blocks). The method includes generating digital noise models that indicate respective digital noise model locations within one or more first circuit blocks and that also indicate corresponding digital noise model values that represent digital switching induced power supply fluctuations associated with such respective digital noise model locations. A proposed floorplan is produced that specifies relative positions of the first and second circuit blocks. A substrate noise model also is produced for the substrate on which the first and second circuit blocks are to be disposed. Noise observation ports are defined for the second blocks. The floorplan and the digital noise model locations are used together to associate digital noise model locations with substrate locations. More particularly, the floorplan which specifies the first circuit block locations relative to second circuit block locations, together with the digital noise model locations within such first circuit blocks, are used to associate digital noise model locations with substrate locations. The floorplan and is used to associate noise observation ports with substrate locations adjacent to corresponding second blocks for which they have been defined. That is, the noise observation ports may be defined nearby or within corresponding second blocks. A first circuit simulation process simulates substrate noise propagation from the digital noise models to the noise observation ports. A second simulation process simulates function of one or more second blocks using noise propagated to one or more noise observation ports associated with such second block as noise input for such second simulation.

In another aspect, a determination is made based upon the functional simulation whether such second block experiences a substrate noise level that is not within a noise constraint. If such second block is determined to experiences a substrate noise level that is not within the noise constraint, then the floorplan is changed in an attempt to bring the substrate noise level experienced by such second block to within the noise constraint.

In yet another aspect, hierarchical designs are obtained for one or more first blocks and for or more second blocks. The hierarchical designs include respective first partitions that represent the one or more first blocks and the one or more second blocks at a first level of abstraction and also include respective second partitions that represent the one or more first blocks and the one or more second blocks at a second level of abstraction. The act of generating the digital noise models includes generating using the first partitions that represent the one or more first blocks. The act of producing a floorplan that specifies positions of the first and second blocks includes producing using the second partitions that represent the one or more first blocks and the one or more second blocks at the second level of abstraction.

In some embodiments, the first and second partitions are constituents of a hierarchical design in which the first partitions include the second partitions. The first partitions include detailed placement and routing information, and the second partitions do not include such detailed placement and routing information.

Thus, a methodology is provided to perform noise analysis early in the design of an integrated circuit, such as a mixed signal IC. Based upon analysis results, a floorplan may be adjusted or guard rings may be inserted to reduce the impact of switching noise upon noise sensitive circuits such as analog circuits.

BRIEF DESCRIPTION OF THE DRAWINGS

The aforementioned features and advantages of the invention, as well as additional features and advantages thereof, will be more clearly understandable after reading the detailed description of embodiments of the invention in conjunction with the following drawings.

DETAILED DESCRIPTION OF THE PREFERRED EMBODIMENTS

The following description is presented to enable any person skilled in the art to make and use a computer implemented system and method and apparatus to use substrate noise information in the development of a floorplan early in an integrated circuit design flow in accordance with embodiments of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and processes are shown in block diagram form in order not to obscure the description of the invention with unnecessary detail. Thus, the present invention is not intended to be limited to the embodiments shown, but is to be accorded the widest scope consistent with the principles and features disclosed herein.

Figure 1:
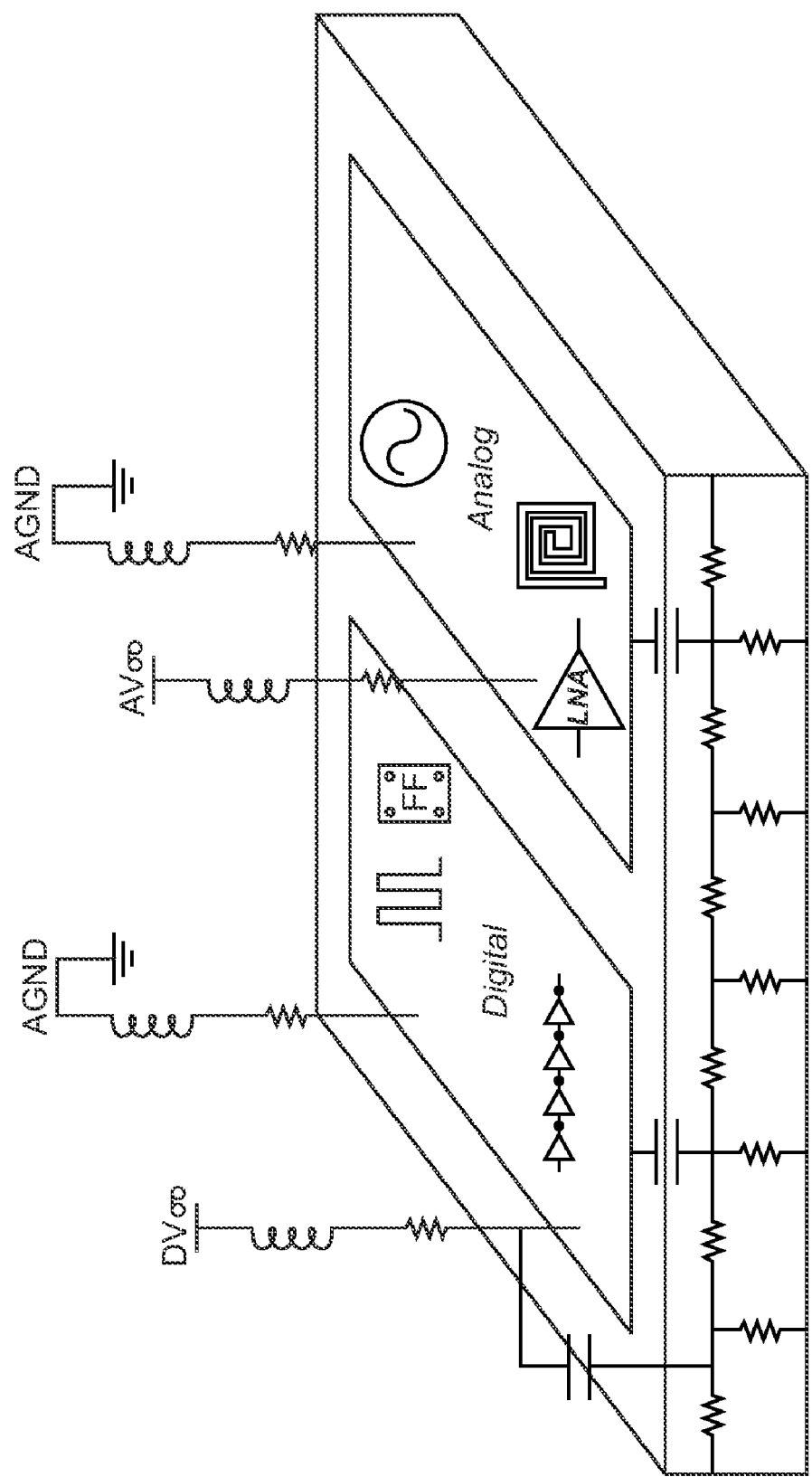
FIG. 1 is an illustrative perspective view of a mixed-signal integrated circuit that includes a digital subsystem and an analog subsystem and that also includes a cross-section view of the IC substrate.
Figure 2:
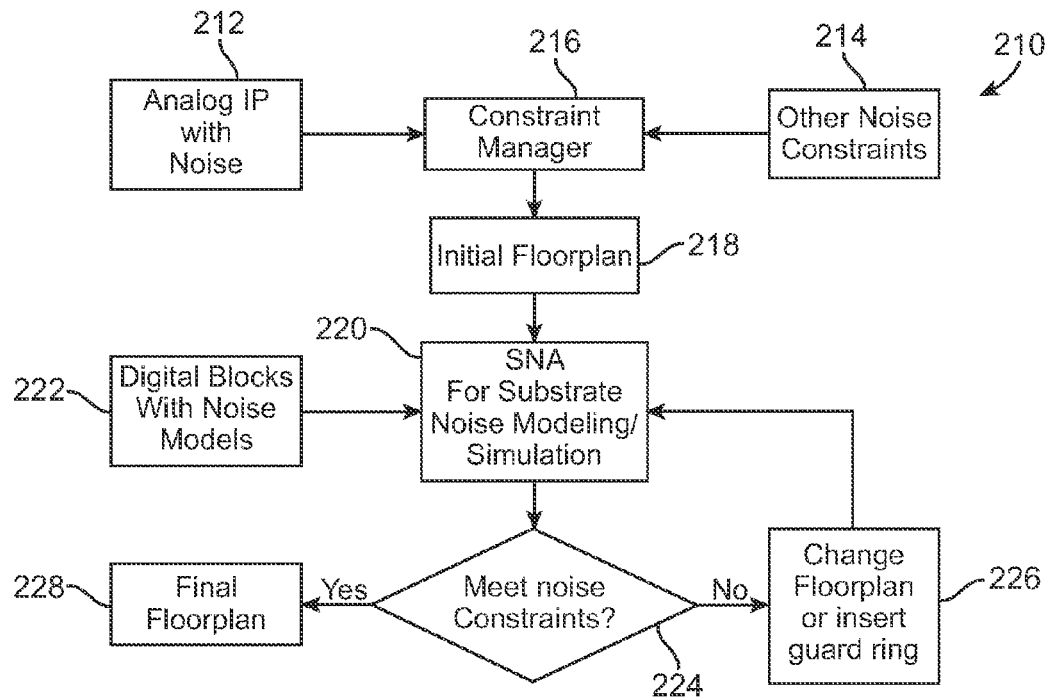
FIG. 2 is an illustrative drawing of a process to develop a substrate noise aware floorplan in accordance with one embodiment of the invention.

FIG. 2 is an illustrative drawing of a process 210 to develop a substrate noise aware floorplan in accordance with one embodiment of the invention. The floorplan process takes advantage of hierarchical design information. Substrate noise information obtained from noise analysis of detailed representations of design blocks is used to guide development of a floorplan involving less detailed versions of the same design blocks.

In general, a hierarchical design typically includes replicated instances of design blocks that may share common abstraction for their logic, timing, routing, and port location models, for example. One advantage of a hierarchical design flow is that replicated block instances can be used as identical objects so that the various design and analysis tasks performed for one instance at a block level do not have to be repeated for each different instance of the same block. Another advantage of a hierarchical design is the containment of complexity. A design may be partitioned into hierarchical blocks such that blocks at different levels in the hierarchy contain different subsets of the total complexity of a flattened version of the block, which contains the full complexity of the block.

As such, different design tools that address different design considerations need not address the full complexity of an entire flattened design. In particular, for example, the physical routing, parasitic extraction, and static timing analysis steps can be separated such that top-level runs involving higher level abstraction blocks use only abstractions of instantiated blocks without exposure to the full transistor, gate, or polygon databases within lower level abstraction blocks. In other words, a design task such as developing a floorplan can be carried out with higher level abstraction blocks representing a given set of functionality that contain only a portion of the complexity of lower level abstraction blocks representing the same given set of functionality. This divide-and-conquer approach can limit the amount of data seen by any one design tool run and can ensure that virtual memory usage and job runtime stay reasonable. Thus, partitioning of a design into a design hierarchy serves to break it into manageable pieces that can benefit from a parallelized effort by a design team. One goal is to allow separable progress of the work both for individual blocks and concurrently at the top-level floorplan. For additional discussion of floorplan techniques, refer to *EDA for IC System Design, Verification and Testing*, edited by L. Scheffer, L. Lavagno and G. Martin, Chapter 14, Design Planning, by Ralph H. J. M. Otten, pages 14-1 to 14-23, CRC Press, 2006.

Referring to FIG. 2, box 212 provides information concerning substrate noise tolerance for each noise sensitive block of the design. Designers generally have a good idea of the substrate noise tolerance of noise sensitive blocks in a design, such as analog circuit blocks. Noise tolerance can be frequency dependent. For instance, noise tolerance of a given noise sensitive block might be 0.3 mv at 200 Mhz and might be 0.13 mv at 500 Mhz. The substrate noise tolerance serves as a basis for substrate noise constraints upon the positioning of noise sensitive blocks, which typically correspond to analog functionality, relative to digital blocks within the design. Box 214 provides information concerning other noise-related constrains such as a predefined minimal spacing requirement between digital and analog blocks. Box 216 represents a constraint manager process that produces an initial floorplan represented by box 218 for objects representing analog and digital blocks for the design based upon the information provided by boxes 212 and 214. The IC designer enters the noise constraints for the pins of the analog macros via the constraint manager. Later the noise thresholds are checked against the noise calculations stemming from the digital noise injection and propagation. Box 220 represents the substrate noise analysis (SNA) that includes substrate noise modeling and simulation process that uses a circuit simulator to calculate the electrical noise levels.

The substrate noise analysis process uses data including process technology files to produce an electrical model of the substrate that includes digital noise injection sources and port structures to observe the substrate noise imparted to noise sensitive objects in the floorplan. Block 222 provides digital noise models that include information concerning estimated digital switching noise injection for digital blocks in the floorplan. It will be appreciated that the relative positioning of substrate noise producing digital blocks and noise sensitive analog blocks is an important factor in determining the likely impact of digital switching noise upon analog block performance. The process represented by box 218 provides an initial floorplan for the relative positioning of analog and digital blocks. The SNA process 220 uses this initial floorplan together with the digital switching noise estimates provided through the digital noise models to produce an overall substrate noise model suitable to estimate the impact of digital switching substrate noise injection upon noise sensitive blocks. Decision step 224 determines whether substrate noise constraints in 212 have been met for each of the noise sensitive blocks for the current proposed floorplan.

In some embodiments, decision step 224 involves performing a functional simulation of noise sensitive blocks with noise determined through the SNA process 220 to have been propagated to those blocks being provided as input to the simulation process. Functional simulation involves application of test inputs to a design model of an integrated circuit in order to simulate circuit functionality. Simulation results can be used to determine whether a noise sensitive block meets functional requirements under the influence of substrate noise propagated from noise sources such as digital blocks. Functional simulation may be performed at different levels of design abstraction. For instance, an RTL simulation can test basic functionality. It also can be used to test analog circuit functional correctness. A simulation of a physical design that includes placement and routing information can be used, for example, to determine whether a circuit meets timing requirements including the effects of gate delay and capacitance and noise. In some embodiments, noise sensitive blocks comprise analog circuit blocks that are simulated using a SPICE netlist.

If the substrate noise constraints have been met and the substrate noise is within tolerance levels for all noise sensitive blocks, then the process 210 proceeds to box 228, which represents acceptance of a current floorplan as a final floorplan, at least from a substrate noise analysis perspective. If on the other hand, the substrate noise constraints have not been met, then a process represented by box 226 changes the floorplan to reduce the noise imparted to noise sensitive blocks to within tolerance levels. The process 226 comprises a substrate noise driven floorplan change process that can be performed either manually or automatically. In a manual approach, noise contour maps can be produced and displayed on a computer screen, for example, to illustrate for a designer the substrate noise levels throughout the floorplan, for example. A designer can move blocks or insert guard rings about noise sensitive blocks based upon contour plots, for example, so that the noise level drops below a specified threshold. In an automatic approach, after a noise analysis has been performed, the blocks can be moved automatically in some direction and for some distances based on pre-determined empirical tables for the technology process employed by the design, for example. Alternatively, rather than moving blocks about to achieve acceptable noise tolerance levels, an automatic version of the change process 226 can insert guard rings about noise sensitive blocks for which substrate noise exceeds acceptable levels. This will reduce the noise levels for the instance. The floorplan development process 210 iterates about the loop including boxes 220-226 until substrate noise tolerance levels are satisfied indicating that an acceptable floorplan 228 has been developed.

Figure 3:
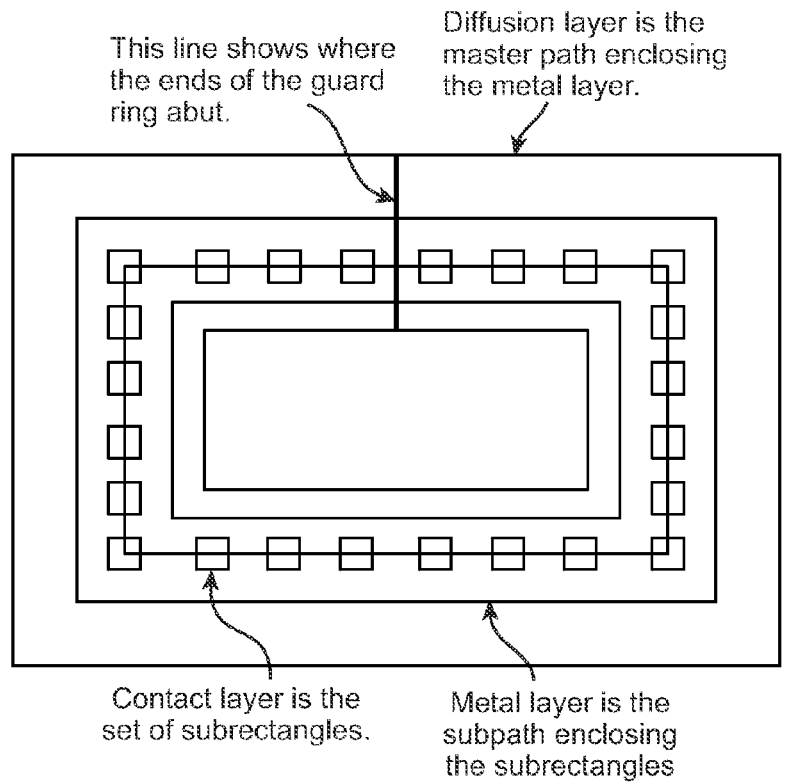
FIG. 3 is an illustrative drawing of a guard ring in accordance with one embodiment of the invention.

FIG. 3 is an illustrative drawing of a guard ring in accordance with one embodiment of the invention. A guard ring may comprise multipart paths whose ends abut. Guard rings can be either p-diffusion or n-diffusion, and are used to enclose one or more noise sensitive objects in the floorpan. Each guard ring typically includes a master path with flush or offset ends, a set of rectangles, and one or more offset sub paths on any layer or layers. Guard ring rules allow one to customize the guard ring to adhere to certain technology rules. Rules may include: contact spacing and dimensions, diffusion enclosing contact and/or diffusion width, and metal 1 width and/or offset. A parameterized guard ring generator can create a guard ring around an analog macro by specifying the width, the layers and their rules.

Figure 4:
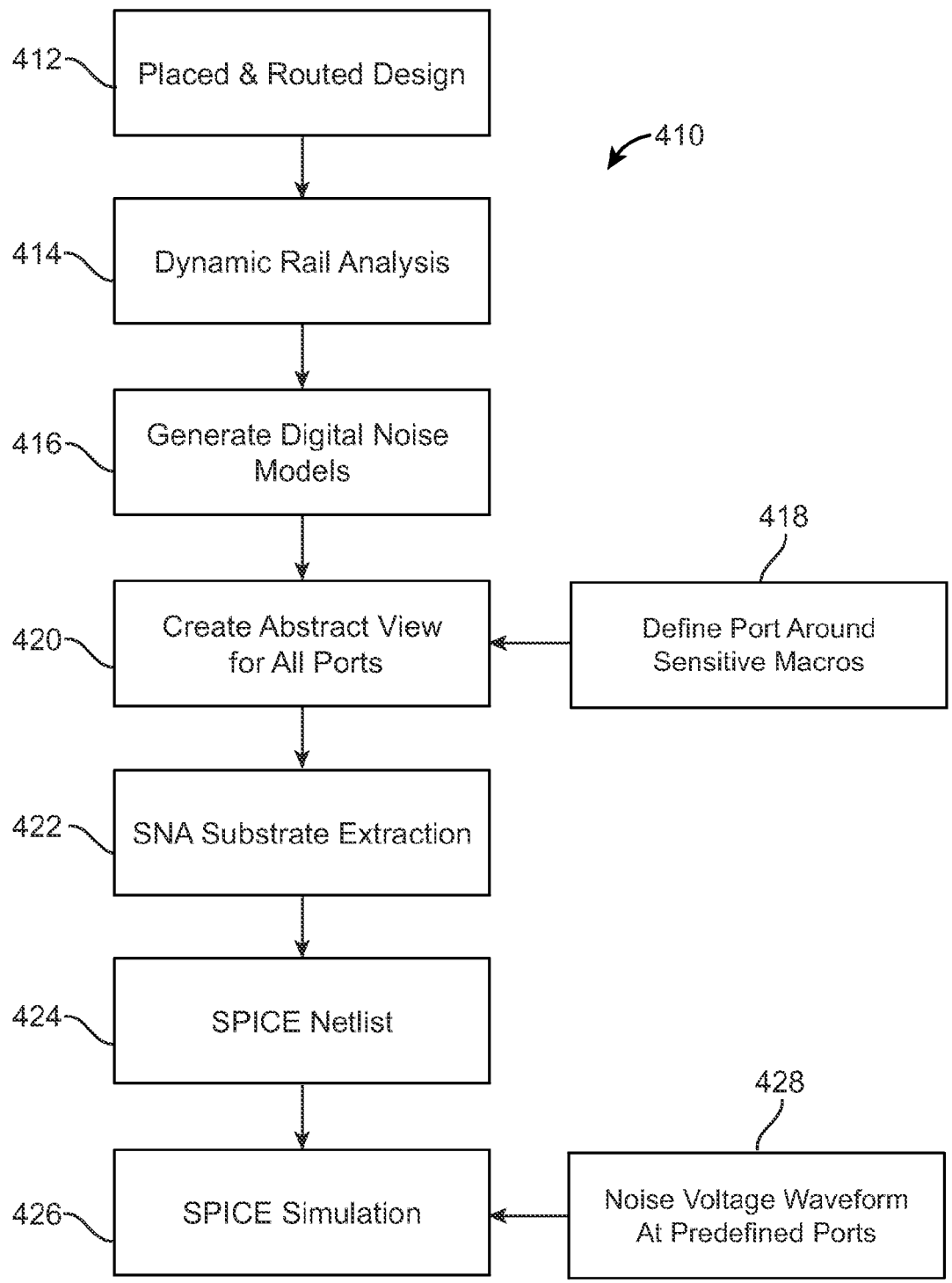
FIG. 4 is an illustrative flow diagram of a process to develop digital block noise models and to estimate substrate noise propagation in accordance with one embodiment of the invention.

FIG. 4 is an illustrative flow diagram of a process 410 to develop digital block noise models and to estimate substrate noise propagation in accordance with one embodiment of the invention. Boxes 412-416 in FIG. 4 generally provide additional details of block 222 in FIG. 2. Boxes 418-428 in FIG. 4 generally provide additional details of block 220 in FIG. 2.

More specifically, box 412 provides placed and routed designs containing both the digital blocks and analog blocks that are to be represented in the floorplan of box 226 of FIG. 2. A process represented by block 414 performs a dynamic rail analysis of the individual digital blocks including decoupling capacitances. A computer aided design tool called, VotageStorm™, produced by Cadence Design Systems, Inc., having a place of business in San Jose, Calif., is one example of one software tool that can be used to perform dynamic rail analysis. A process represented by block 416 produces digital noise models for the digital blocks to be included within the floorplan. Box 418 represents a process to define noise observation ports adjacent to noise sensitive blocks to be included within the floorplan. The noise observation ports can be sensitive locations inside sensitive blocks or can be around sensitive blocks. The noise estimated at these ports can be used as inputs for a second stage simulation involving detailed information of sensitive blocks to evaluate the sensitive blocks in the light of the substrate noise. The significance of this approach is it can reduce the size of the problem to do the full chip simulation for substrate noise estimation to a manageable one without much accuracy sacrifice.

Box 418 defines the analog macro ports at which noise is to be measured. While the process represented by box 420 creates an abstract view of all ports including ports formed by physical layout of digital cells through which the digital noise injects. A process represented by box 422 extracts the substrate parasitics and outputs an extracted substrate netlist represented by box 424. In one embodiment, the netlist comprises a SPICE netlist. A process represented by box 426 performs a simulation of the netlist with transient analysis. The simulation process may use a software tool such as a SPICE simulator or an Ultrasim™ simulator, produced by Cadence Design Systems, Inc., having a place of business in San Jose, Calif. Box 428 represents noise waveforms generated during simulation, at the noise observation ports defined adjacent to the noise sensitive blocks within the floorplan.

It will be appreciated that the processes of blocks 412-416 of FIG. 4 involve analyses of first partitions of digital function blocks represented in a hierarchical design that include placement and routing details for such blocks. This detailed design information is used to produce simplified noise models that are provided to the SNA process 220 of FIG. 2. The same digital function blocks, in second partition that do not include the detailed placement and routing information, are represented in the initial floorplan 218 of FIG. 2. The first partitions that include the detailed placement and routing information, also contain the second partitions, which do not include such detailed information. The substrate noise analysis (SNA) process 220 uses the digital noise models to generate estimated substrate noise waveforms at the observation ports. Thus, the SNA process 220 of FIG. 2 is simplified in that substrate noise estimates are generated without the need to handle the complexity of the placed and routed partitions of the digital blocks. Rather, such digital blocks are represented in the SNA process as simplified digital noise models. As a result, less computational cost is required for the iterative floorplan development process of the loop and smaller problem size are achieved.

Figure 5B:
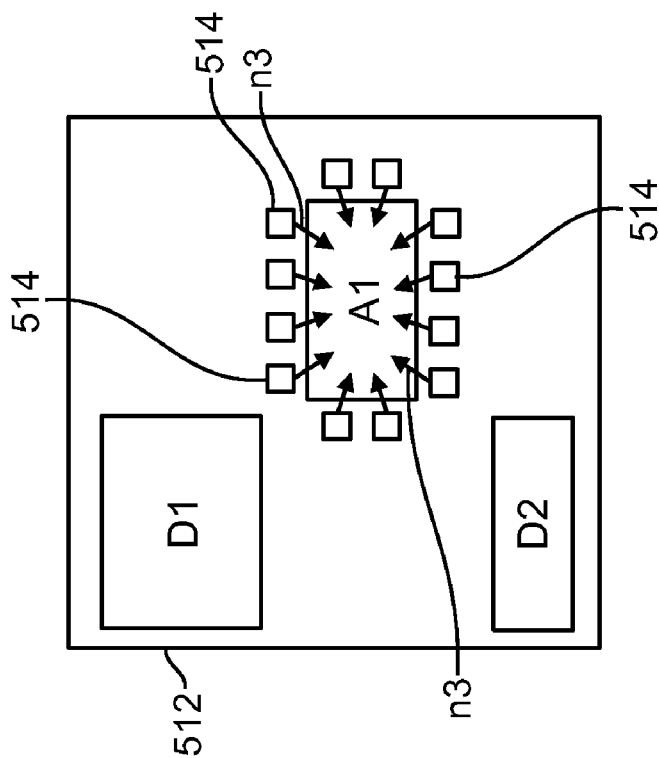
FIGS. 5A-5B are illustrative drawings of a simplified floorplan used to represent a staged process to propagate estimated digital switching induced substrate noise from digital blocks D1 and D2 to a noise sensitive analog block A1.
Figure 5A:
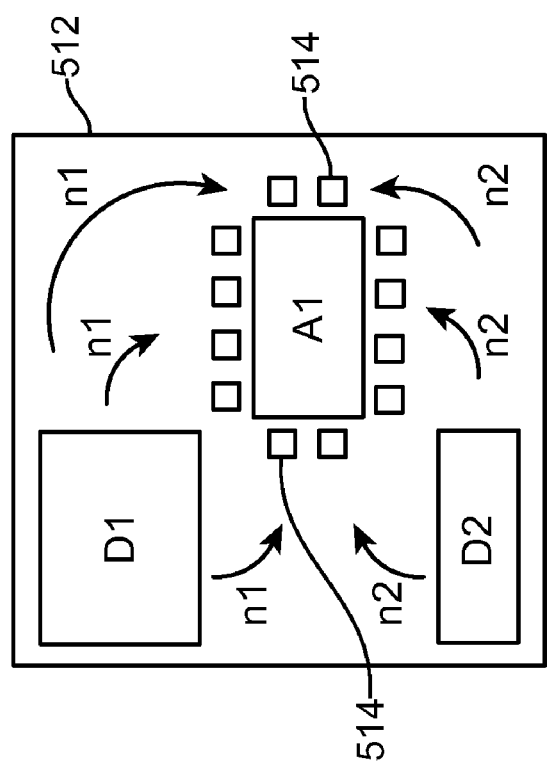

FIGS. 5A-5B are illustrative drawings of a simplified floorplan used to represent a staged process to propagate estimated digital switching induced substrate noise from digital blocks to a noise sensitive analog block. FIGS. 5A-5B show a substrate 512 having a first digital block D1, a second digital block D2 and an analog block A1. A plurality of noise observation ports 514 defined in boxes 418 and 420 of FIG. 4, are disposed at substrate locations adjacent to and outside block A1.

FIG. 5A shows that during an earlier stage of the SNA simulation process 220 in accordance with one embodiment of the invention, a model of the substrate 512 produced by SNA process 220 of FIG. 2 is used to propagate digital switching induced substrate noise, n1, produced by the first digital block D1 to the ports 514. Similarly, during such earlier stage of the simulation process, the substrate model is used to propagate digital switching induced substrate noise, $n_2$, produced by the second digital block D2 to the ports 514. The noise from the multiple digital blocks is superimposed at the observation ports. FIG. 5B shows that during a later stage of the SNA simulation process 220 in accordance with one embodiment of the invention, the model of the substrate 512 is used to propagate the aggregated substrate noise, $n_3$, from the observation ports 514 to substrate locations within the analog block A1. This multi-stage substrate noise propagation process is advantageous in that it reduce the size of a full chip substrate noise simulation problem into two subproblems with manageable sizes.

Figure 6B:
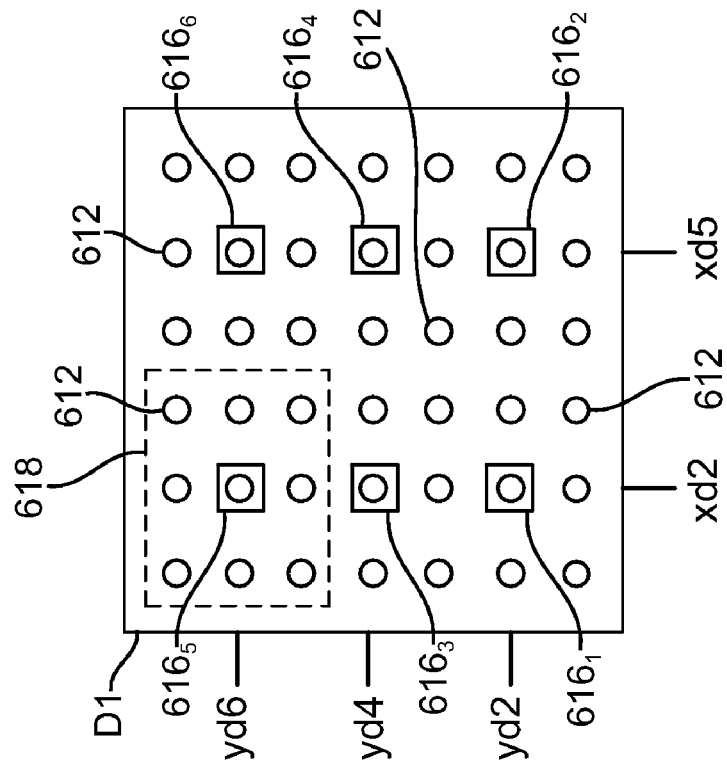
FIGS. 6A-6B are illustrative drawings of a simplified view of a partition of a one of the digital blocks D1 shown in FIGS. 5A-5B.
Figure 6A:
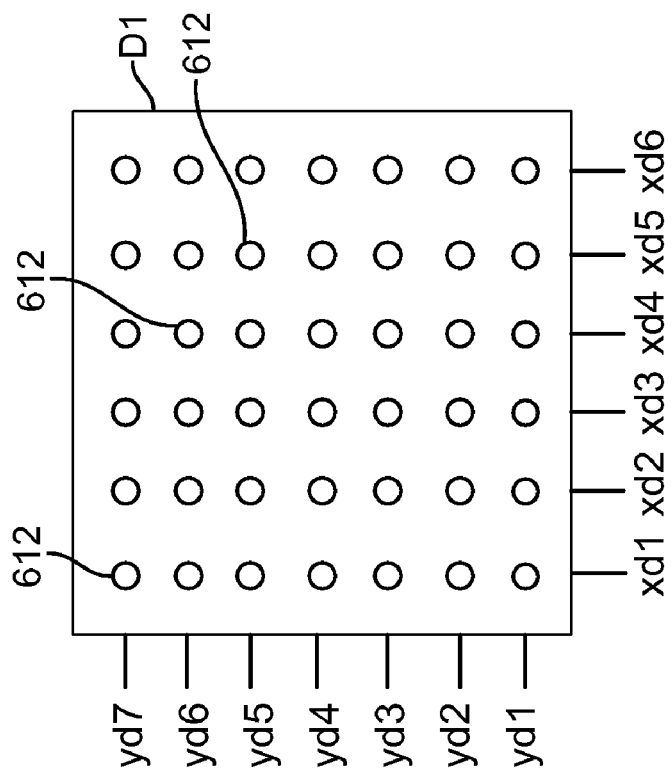

FIGS. 6A-6B are illustrative drawings of a simplified view of a partition of block D1 of FIGS. 5A-5B that includes details concerning the contact layout of digital noise models within the digital macro. FIG. 6A shows digital block D1 having a plurality of power supply and ground fluctuation induced noise sources 612 corresponding to power supply and ground contacts at location $(X_{d1}, Y_{d1})$ in the lower left to the contact $(X_{d6}, Y_{d7})$ at the upper right. In one embodiment, a dynamic power grid analysis described below is used to determine noise waveform values for each contact location. FIG. 6B shows digital block D1 with aggregated substrate noise sources $616_1$-$616_6$ within the rectangles at locations $(X_{d2}, Y_{d2})$, $(X_{d5}, Y_{d2})$, $(X_{d2}, Y_{d4})$, $(X_{d5}, Y_{d4})$, $(X_{d2}, Y_{d6})$ and $(X_{d5}, Y_{d6})$. As explained below, the aggregated noise sources 616 serve as the location components, relative to the block D1, of noise models associated with digital block D1. For example, the location $(X_{d2}, Y_{d6})$ serves as an aggregated substrate noise source $616_6$ for contacts 612 located at within the dashed lines labeled 618.

Figure 7B:
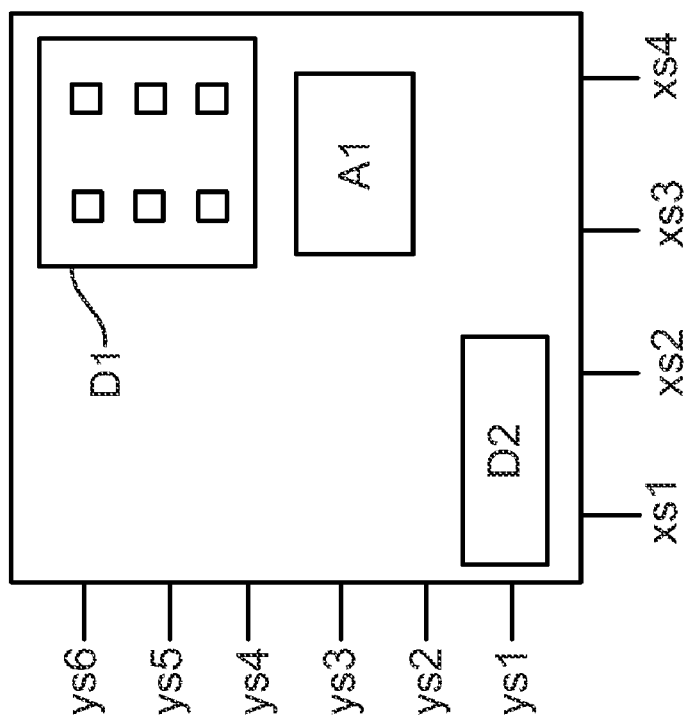
FIGS. 7A-7B are illustrative drawings of two iterations of a floorplan that represent the movement of one of the digital blocks D1 in FIGS. 5A-5B in the course of the iterations of a process loop of FIG. 2.
Figure 7A:
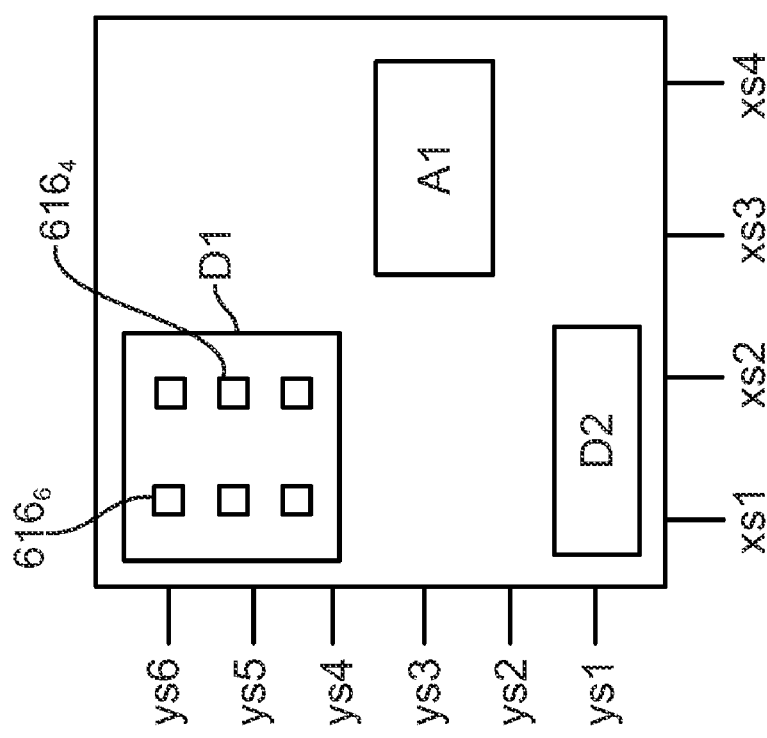

FIGS. 7A-7B are illustrative drawings of two iterations of a floorplan that represent the movement of digital block D1 of FIGS. 5A-5B in the course of iterations of boxes 220-226 of FIG. 2. In FIG. 7A, digital block D1 is disposed at a first location and its corresponding digital substrate noise source locations $616_1$-$616_6$ have respective first locations relative to the substrate locations and relative to the analog block A1. For instance, in FIG. 7A, digital substrate noise source location $616_5$ at location $(X_{d2}, Y_{d6})$ of block D1 is associated with substrate location $(X_{s1}, Y_{s6})$. In FIG. 7B, the digital block D1 is disposed at a second location and its corresponding digital noise source locations $616_1$-$616_6$ have respective second locations relative to substrate locations and relative to the analog block A1. For example, in FIG. 7B, substrate digital noise source location $616_5$ at location $(X_{d2}, Y_{d6})$ of block D1 is associated with substrate location $(X_{s3}, Y_{s6})$.

The SNA process 220 of FIG. 2 is used to perform the substrate noise propagation process illustrated with reference to FIGS. 5A-5B to produce noise waveforms at observation ports adjacent to the noise sensitive analog block A1. A functional simulation 224 of the analog block A1 is performed in which noise propagated to observation ports associated with it is used as input to the functional simulation process. In some embodiments, a detailed partition of the analog block A1 is used during the functional simulation. Results of the functional simulation are used to determine whether the first or the second location for D1 results in substrate noise within tolerance ranges acceptable for the analog block A1. If not, then a guard ring may be added or the blocks may be moved relative to each other 226, and another round of SNA 220 and functional simulation 224 is performed.

Dynamic Power Grid Analysis

Box 416 of FIG. 4 refers to a dynamic rail analysis process. In one embodiment, the dynamic rail analysis involves a dynamic power grid analysis (DPGA) process that produces waveforms used in substrate noise analysis. Although DPGA is known to persons having ordinary skill in that art, and itself forms no part of the invention, it is useful to understand the relationship between DPGA and substrate noise analysis in accordance with embodiments of the invention, to better appreciate the invention. The following section on DPGA is provided to explain that relationship.

Figure 8B:
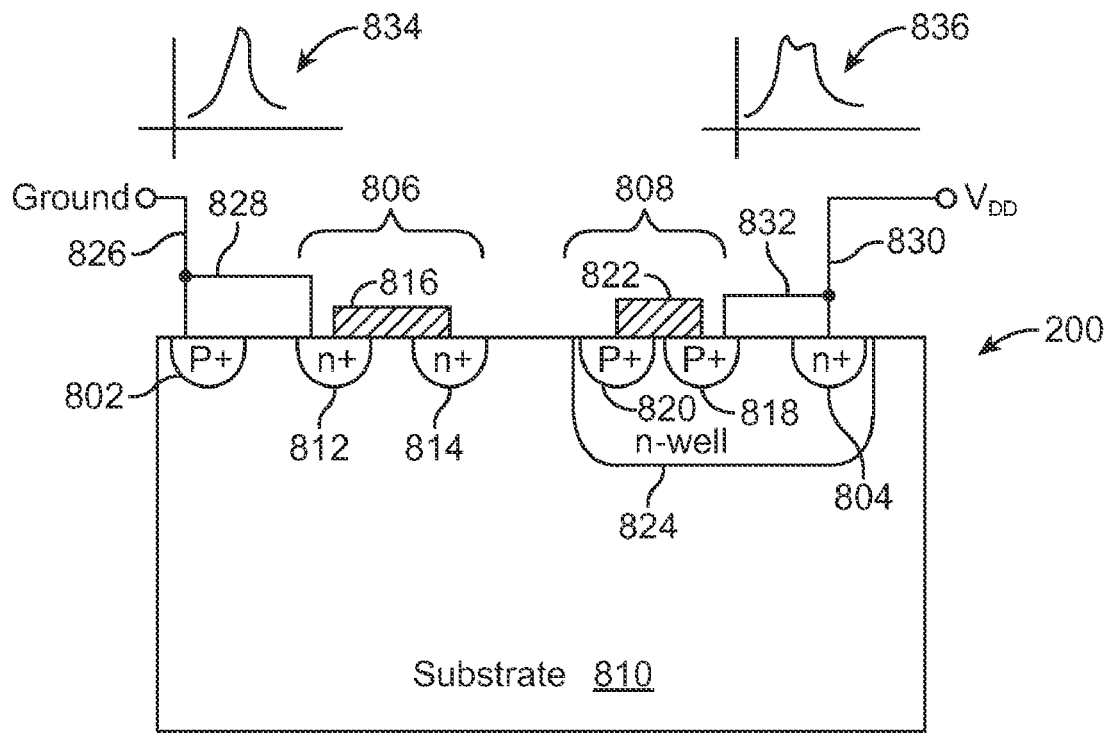
FIG. 8B is an illustrative cross-section view of an NMOS transistor and a PMOS transistor of the NOR gate cell of FIG. 8A.
Figure 8A:
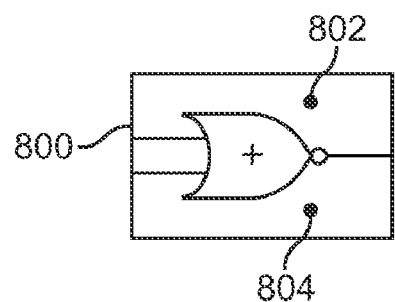
FIG. 8A is an illustrative drawing of an example NOR gate cell instance from a typical cell library.

FIG. 8A is an illustrative drawing of an example gate cell instance 800 from a typical cell library. The example gate cell is a NOR gate. The gate cell comprises multiple transistors (not shown) connected to perform a NOR logic function. The example gate cell includes NMOS and PMOS transistors. The gate cell 800 includes a substrate contact 802 and a well contact 804.

FIG. 8B is an illustrative cross-section view of an NMOS transistor 806 and a PMOS transistor 808 of the gate cell 800 of FIG. 8A. The NMOS and PMOS transistors 806, 808 are formed in a substrate 810. The NMOS transistor 806 includes an n+ source 812, an n+ drain, 814 and a gate 816. The PMOS transistor 808 includes p+ source 818, a p+drain 820 and a gate 822. The PMOS device 808 is disposed in an n-well region 824. The n+ source 812 is coupled to ground potential. In particular, a ground potential wire 826 from a ground potential power distribution network (not shown) is coupled to the bulk substrate 810 through a p+ substrate contact 802. A conductor line 828 interconnects the ground-connected p+ substrate contact 802 with the n+ source 812. The p+ source 818 of the PMOS transistor 808 is coupled to VDD potential. Specifically, a VDD potential wire 830 from a VDD potential power distribution network (not shown) is connected to an n+ well contact 804. A conductor line 832 interconnects the VDD-connected n+ well contact 804 with the p+ source 818.

Conventionally, waveforms such as waveform 834 and waveform 836 have been produced in the course of a voltage-drop analysis process, sometimes referred to as IR-drop analysis or power grid analysis, which aims to ensure power grid integrity. ICs ordinarily include a power supply distribution network that distributes power to each active cell instance or macro of the chip. The power supply distribution network includes both a $V_{DD}$ potential distribution network and a Ground distribution network. The resistance of interconnects constituting the power distribution network results in a voltage drop across the network, which is commonly referred to as IR drop. During voltage-drop analysis, voltage and/or current waveforms are associated with power and/or ground substrate/well contacts of gate cell instances or macros of an integrated circuit.

The inventors herein have found that these DPGA generated waveforms also can be used to represent noise injection at cell instance substrate/well contacts due to fluctuations in $V_{DD}$ and/or ground power supply attendant to digital circuit switching. According to one aspect of the invention, waveforms developed in the course of dynamic power grid analysis are used as the stimulus waveforms during substrate noise analysis to simulate substrate noise injection due to voltage fluctuations in a power distribution network of a semiconductor integrated circuit (IC).

Thus, in accordance with one aspect of the invention, DPGA generated waveforms associated with the substrate/well contacts of cell instances or macros of an integrated circuit are used to simulate substrate noise injection. The illustrative drawing of FIG. 8B shows an example stimulus voltage waveform 834 associated with the ground-connected p+ substrate contact 802 and also shows a stimulus voltage waveform 836 associated with the $V_{DD}$-connected n+ well contact 804.

As illustrated in FIGS. 8A-8B, each cell instance or macro includes at least one contact disposed on the IC that serves as a physical electrical connection between the functional circuitry of the cell instance and the power supply network. Such contacts provide electrical connection to $V_{DD}$ potential and/or to ground potential used to electrically bias the circuitry of the cell instances or macros of the IC. Also, for example, the substrate may be biased by substrate/well contacts, sometimes referred to as taps, to prevent latch-up. Substrate/well taps may be specified in a standard cell library or supplied by separate well tap cells, which only consist of substrate/well taps for biasing a substrate.

Power grid analysis processes are well known to persons of ordinary skill in the art. In view of the large size of a typical power grid network, simulation of a power grid often has been performed in two steps so as to make the simulation process computationally manageable. Nonlinear devices are first simulated assuming perfect supply voltages, and the currents drawn by the devices (e.g., transistors) are measured. Next, these devices are modeled as independent time-varying current sources to simulate the power grid, and voltage drops at individual devices are measured. Through this two step simulation process, power grid analysis is reduced to solving a large linear network.

Due to signal correlations between circuit blocks of an IC, device circuit currents are interdependent. These correlations often are accounted for during power grid analysis by deriving device circuit currents for individual blocks of the IC from the results of logic simulation using a common set of input patterns. One consideration in power grid analysis is to determine what these input patterns should be. For IR drop analysis, patterns that produce the maximum instantaneous current ordinarily are used.

In the past, power grid analysis often was performed with static, i.e., steady-state, data. In such static analysis, the average current drawn by a cell instance was used. The IR drop over the entire power grid was computed using the average current drawn by each cell. This was sufficient when chips were smaller and operating at lower frequencies. Recently, it has been observed that the variation of the power supply voltage over time is important to control. This has lead to the development of a form of power grid analysis referred to as dynamic power grid analysis (DPGA). In some DPGA embodiments, the currents drawn by different cell instances are modeled as current waveforms. These current waveforms are used during DPGA to calculate the voltage waveforms that exist at specific locations on the power supply grid.

In some embodiments, DPGA involves a determination of the power dissipation by each cell instance of the IC. Since each cell instance can draw a different amount of power depending on its inputs, power analysis can be done either using vectors or some average switching activity. In either case, for DPGA, the power drawn by a cell instance is converted to a current waveform that represents switching of the cell. If the cell instance does not switch for a given set of inputs, then a constant leakage current is determined. If the cell instance switches for a given set of inputs, then a power analysis process determines the current waveform at power grid contacts of such switching cell instance. A static timing analysis is performed prior to DPGA to determine the relative times at which each cell instance may switch. The calculated current waveforms are associated with contacts in the extracted electrical network model. The relative times at which each cell instance may switch is used to position the switching waveforms for each cell instance at the right "global time". The network created above is solved to determine the voltage waveforms at different points in the power grid. This is done using well known linear circuit simulation techniques. The aforementioned computer aided design tool called, VotageStorm™ is one example of one software tool used to perform DPGA.

Voltage-drop analysis can be applied across different IC design stages. These stages are characterized by different models of the power distribution network and of current being drawn by functional blocks. As a design process progresses, models that are more and more accurate can be used for the power grid and block currents. A power grid analysis can be performed early, before a chip floorplan has been designed, post floorplan, after a global power distribution network has been designed and the logic blocks have been placed, or postlayout, after global and block-level grids have been fully designed. For additional information concerning voltage-drop analysis refer to, EDA for IC Implementation, Circuit Design, and Process Technology, Edited by L. Scheffer, L. Lavagno and G. Martin, Chapter 20, Design and Analysis of Power Supply Networks, by D. Blaauw, S. Pant, R. Chaudhry and R. Panda, pages 20-1 to 20-14, CRC Press, 2006.

Thus, individual voltage waveforms are associated with electrical contacts of cell instances or macros in an IC design. The waveforms are encoded in computer readable medium as is a model of the power grid network having electrical contacts to individual cell instances. The waveforms are indicative of voltage changes in the power grid network at the physical locations in the design at which the contacts are disposed. The inventors have realized that the waveforms also are indicative of localized noise injected to the IC substrate due to power grid fluctuations caused by switching of circuit cell instances.

Digital Noise Models

Box 416 of FIG. 4 refers to generating digital noise models. In one embodiment of the invention, digital noise models are used to represent the estimated noise injected to the IC substrate by a digital circuit block. A digital noise model includes an electrical component and a physical location component. The electrical component comprises a voltage and/or current waveform that represents digital noise injected to the substrate. A digital noise model can be produced for individual contacts. For an individual contact, the electrical component of a digital noise model comprises an IR-drop waveform associated with that contact. Separate waveforms may be associated for $V_{DD}$ and Ground contacts. The physical location component for an individual contact comprises the location where the noise waveform is injected to the substrate. Specifically, the electrical component of a digital noise model for an electrical contact represents the substrate noise injected through the contact. The physical location component of a digital noise model for an electrical contact comprises physical (x, y) locations of the contacts through which such substrate noise is injected. Digital noise models for contacts may be encoded in computer readable code in a computer storage medium.

For example, an electrical component of a digital noise model corresponding to an individual electrical contact associates one or more waveforms produced by an IR drop analysis such as a DPGA process with the electrical contact. Since such electrical contact has a physical location in a digital block, by associating the waveforms with the electrical contact, the digital noise model also associates the waveforms with the physical location of the electrical contact. It will be appreciated that the DPGA process may result in production of different waveforms corresponding to different simulated input signal patterns to an IC. Accordingly, the electrical component of a digital noise model associates different waveforms with the electrical contact depending upon the simulated input signal pattern.

Figure 9:
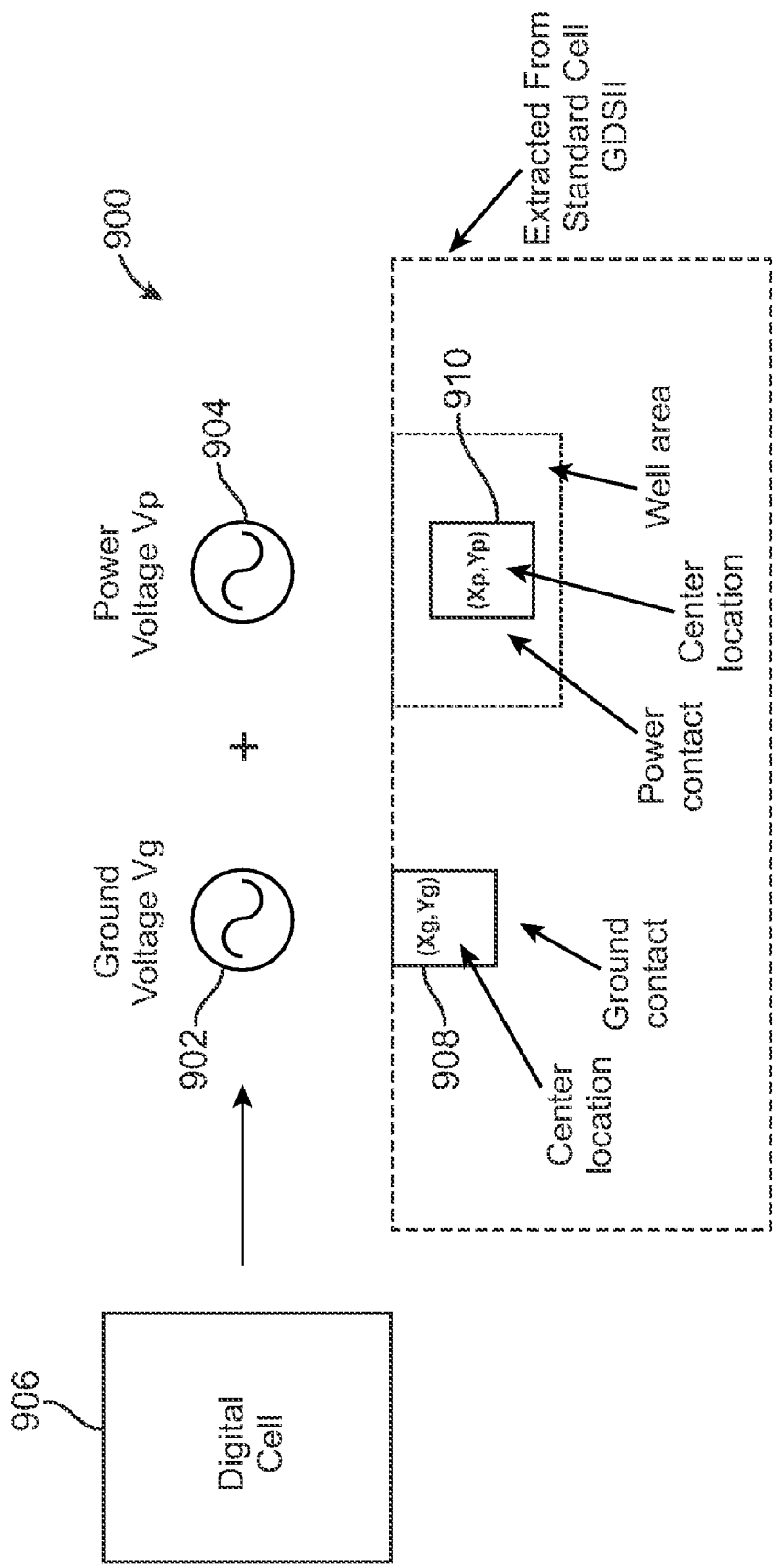
FIG. 9 is an illustrative drawing representing an example digital noise model with location information and voltage sources derived from dynamic IR drop values in accordance with some embodiments of the invention.

FIG. 9 is an illustrative drawing representing an example digital noise model 900 with voltage sources derived from dynamic IR drop values in accordance with some embodiments of the invention. The digital noise model is associated with a ground and power contacts, 902, 904 of a digital cell instance 906. The ground contact 908 is coupled in the IC design to a $V_{SS}$/ground network of the power grid, and a power contact 910 is coupled in the IC design to a $V_{DD}$, network of the power grid. The digital noise model includes a ground contact voltage waveform Vg 902 derived from a corresponding dynamic IR drop waveform (not shown) produced in the course of a DPGA analysis. The digital noise model also includes a power voltage waveform Vp 904 derived from a from a corresponding dynamic IR drop waveform (not shown) produced in the course of a DPGA analysis. In some embodiments, Vg and Vp are the worst case voltage waveforms as explained below. The digital noise model includes an indication of a physical (Xg, Yg) location of a center point of the ground contact 910 and also includes an indication of a center point of a physical (Xp, Yp) location of a center point of power contact 910.

In some embodiments, an aggregate digital noise model is built as explained. For example a single noise source per digital block could be used, and its location is placed at the center of the digital block. Propagated noises from all digital blocks are then added up at any location of the chip, and measured at all the specified analog ports.

These digital noise models provide noise source input to an electrical network model of the substrate that is produced by the SNA process 220.

A digital noise model can be supplied for digital IP that acts as a substrate noise source. The noise model for a digital IP may contain a list of digital noise models with associated physical locations for noise injection. The electrical part of the digital noise model can be defined in a separate SPICE netlist file with model names that match the voltage sources or in general sub circuit names in SPICE netlist file. In other words, an IP vendor may provide digital noise model information for a licensed IP for which a designer does not have detailed information.

In some embodiments, the electrical component of a digital noise model also includes a sub-circuit model used to determine digital noise injection associated with an electrical contact due to a waveform associated with the digital noise model. The sub-circuit model may include magnitude, frequency and phase information of a waveform representing digital noise injection to an electrical contact and also may include values for parasitics (e.g., R, C, L) that affect injection of such digital noise to the substrate. For example, a Thevinin equivalent may be created in which a voltage waveform is connected to a resistance. Such sub-circuit model can be used to represent voltage injection from $V_{DD}$ in which only an AC component of the waveform is taken and the resistance is used to show that it can be attenuated. A more complex representation, for example, may include both a resistor and a capacitor so show that the DC component can be blocked. For example, the ground contact 802 in FIG. 8B, which couples directly to the substrate 810, may be represented as a resistor R; whereas the power contact 904 in FIG. 8B, which couples to the substrate 810 through n-well 824, may be represented as an RC connection.

Substrate Extraction, Substrate Netlist and Simulation

Figure 10:
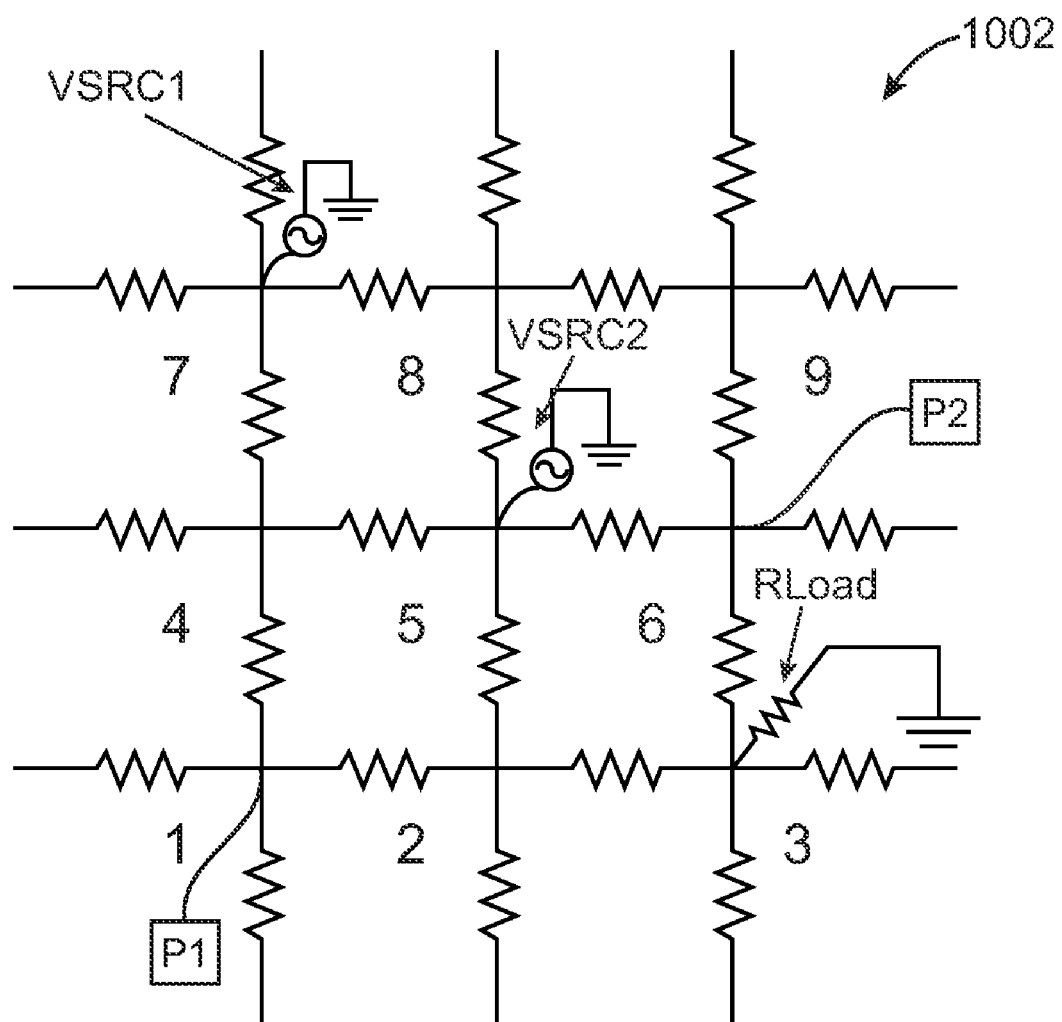
FIG. 10 is an illustrative simplified circuit diagram showing details of an electrical resistive network representing a noise model of the substrate.

FIG. 10 is an illustrative simplified circuit diagram showing details of an electrical resistive network representing a noise model of the substrate. In the prior art the substrate will be partitioned into sub volumes depends on the methods and based on the doping profile of the substrate an electrical network consisting of RCL could be produced. Commonly owned U.S. patent application Ser. No. 11/769,670, filed Jun. 27, 2007 entitled, Method and Apparatus for Substrate Noise Analysis Using Substrate Tile Model and Tile Grid; and commonly owned U.S. patent application Ser. No. 11/769,675, filed Jun. 27, 2007 entitled, Method to Produce Substrate Noise Model and Related System and Article of Manufacture, both of which are expressly incorporated herein by this reference, disclose a tile based approach to developing a substrate noise model.

The illustrated substrate model comprises a resistor network, which may be represented as a SPICE netlist, for example, according to box 424 in FIG. 4. Alternatively, for example, a substrate noise model could be produced that includes RC coupling. Example digital switching induced substrate noise voltage sources VSRC1 and VSRC2 are shown coupled to the substrate noise model. In order to simplify the drawing, sub-circuit contact models are not shown. Example noise observation ports P1 and P2, according to boxes 418-420 of FIG. 4, also are shown. These ports could also correspond to locations 514 in FIGS. 5A-5B. The substrate noise model is used to calculate substrate noise at observation ports P1 and P2 imparted by VRSC1 and VSRC2.

In one embodiment, an SNA simulation process of box 426 of FIG. 4 involves use of a conductance matrix and current source vector to solve the electrical network of FIG. 10 in order to compute noise values at P1 and P2 due to substrate noise sources VSRC1 and VSRC2 as illustrated with reference to FIG. 5A. To get all the unknown voltage values at the nodes that no voltage sources associated is to solve the following linear equation:

$$GV=I \tag{1}$$

Where G is the conductance matrix with size N×N, N is the number of nodes that have no voltage source associated with. V is the N×1 vector representing the unknown voltage values on the N nodes that need to be solved. The right hand side current vector I is an N×1 vector and containing known current sources at N nodes. This is used for the first stage propagation of the two-stage process of FIGS. 5A-5B. We use the standard stamping method with the following modification to generate G which is always positive definite.

Figure 11:
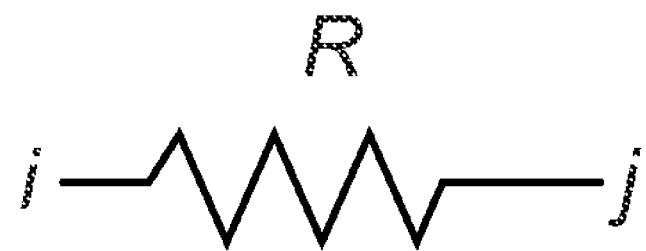
FIG. 11 is an illustrative drawing of a resistor R having two nodes i and j having unknown voltage.

FIG. 11 is an illustrative drawing of a resistor R having two nodes i and j having unknown voltage. The contribution of resistor R to the conductance matrix is calculated in the following way:

$$\begin{matrix} & i & j \\ i & \begin{pmatrix} \frac{1}{R} & \frac{-1}{R} \\ \frac{-1}{R} & \frac{1}{R} \end{pmatrix} \end{matrix} \tag{2}$$

Figure 12:
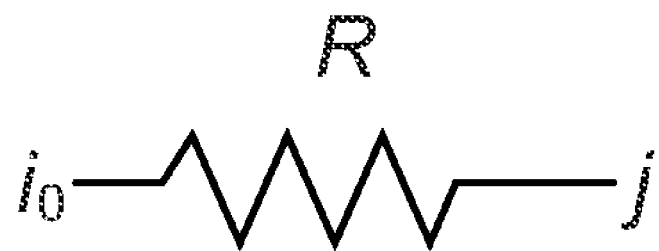
FIG. 12 is an illustrative drawing of a resistor R that has one node having an unknown voltage value $i_0$ and one node having a known voltage value j.

FIG. 12 is an illustrative drawing of a resistor R that has one node having an unknown voltage value $i_0$, and one node having a known voltage value j. For the resistor of FIG. 12 with one node having known voltage value (i.e., attached to a voltage source) the update to the conductance matrix G is done in the following way:

$$\begin{matrix} & i_0 & j \\ i_0 & \begin{pmatrix} & \frac{1}{R} \end{pmatrix} \end{matrix} \tag{3}$$

Additionally it will also have a component in $i_0$ th row in I vector with the value:

$$i_0 \left( \frac{V_{i_0}}{R} \right) \tag{4}$$

There are many known numerical algorithms that can be utilized to solve the linear system in (1). Currently we utilize any of three known methods. The first one is based on LU decomposition. The G matrix is decomposed into two matrixes L and U which are lower triangular and upper triangular in form. This method is not suitable for solving large linear systems since it is slow. The next two methods are taking advantage of the fact that G matrix is positive definite and sparse. They are faster in solving linear system (1) with millions of nodes or unknowns. Specifically the second one is incomplete Cholesky conjugate gradient method normally called ICCG. The third method is based on Gaussian elimination with special indexing for fast performance. For a more detailed discussion on solving large linear systems like (1) see Gene H. Golub and Charles F. Van Loan, "Matrix Computations", Third Edition, 1996, The Johns Hopkins University Press.

Figure 13:
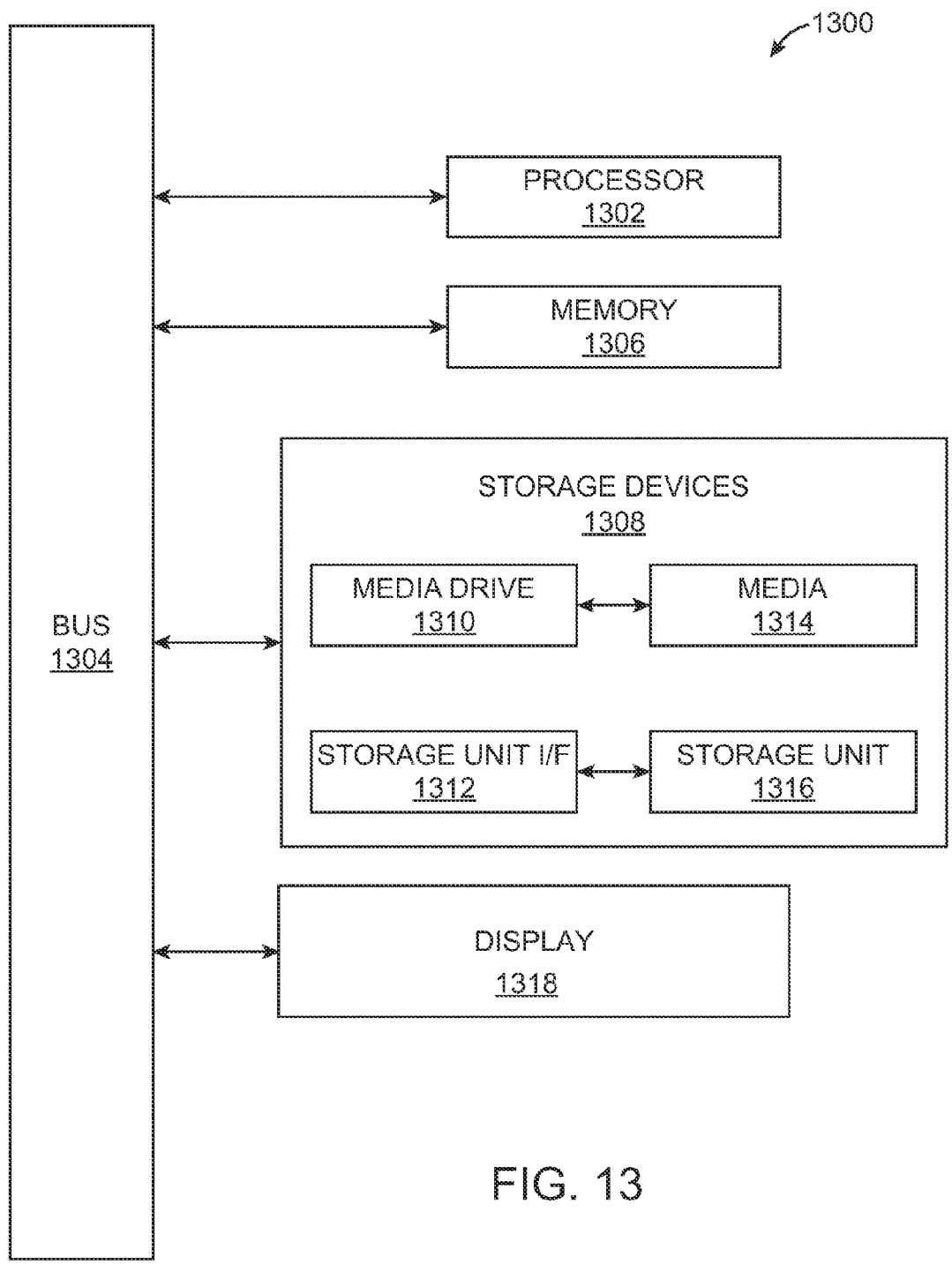
FIG. 13 is an illustrative block level diagram of a computer system that can be programmed to implement processes involved with the analysis of noise substrate noise propagation and floorplan development in accordance with embodiments of the invention.

FIG. 13 is an illustrative block level diagram of a computer system 1300 that can be programmed to implement processes involved with the analysis of noise substrate noise propagation and floorplan development in accordance with embodiments of the invention. Computer system 1300 can include one or more processors, such as a processor 1302. Processor 1302 can be implemented using a general or special purpose processing engine such as, for example, a microprocessor, controller or other control logic. In the example illustrated in FIG. 13, processor 1302 is connected to a bus 1304 or other communication medium.

Computing system 1300 also can include a main memory 1306, preferably random access memory (RAM) or other dynamic memory, for storing information and instructions to be executed by processor 1302. Main memory 1306 also may be used for storing temporary variables or other intermediate information during execution of instructions to be executed by processor 1302. Computer system 1300 can likewise include a read only memory ("ROM") or other static storage device coupled to bus 1304 for storing static information and instructions for processor 1302. The main memory 1306 and the storage devices 1308 may store data such as substrate noise information and proposed floorplan information, for example. The main memory 1306 and the storage devices 1308 may store instructions such as instructions to develop a substrate model that includes observation ports and that receives substrate model information. The main memory 1306 and the storage devices 1308 also may store instructions to simulate the propagation of substrate noise from digital block noise sources to substrate noise sensitive analog blocks.

The computer system 1300 can also includes information storage mechanism 1308, which can include, for example, a media drive 1310 and a removable storage interface 1312. The media drive 1310 can include a drive or other mechanism to support fixed or removable storage media 1314. For example, a hard disk drive, a floppy disk drive, a magnetic tape drive, an optical disk drive, a CD or DVD drive (R or RW), or other removable or fixed media drive. Storage media 1314, can include, for example, a hard disk, a floppy disk, magnetic tape, optical disk, a CD or DVD, or other fixed or removable medium that is read by and written to by media drive 1310. Information storage mechanism 1308 also may include a removable storage unit 1316 in communication with interface 1312. Examples of such removable storage unit 1316 can include a program cartridge and cartridge interface, a removable memory (for example, a flash memory or other removable memory module). As these examples illustrate, the storage media 1314 can include a computer useable storage medium having stored therein particular computer software or data.

The computer system 1300 also includes a display unit 1318 that can be used to display information such as contour maps representing substrate noise for a given proposed floorplan. Moreover, the display unit can be used to display substrate noise information associated with digital and analog blocks in a design and to display their proposed relative positions.

In this document, the terms "computer program medium" and "computer useable medium" are used to generally refer to media such as, for example, memory 1306, storage device 1308, a hard disk installed in hard disk drive 1310. These and other various forms of computer useable media may be involved in carrying one or more sequences of one or more instructions to processor 1302 for execution. Such instructions, generally referred to as "computer program code" (which may be grouped in the form of computer programs or other groupings), when executed, enable the computing system 1300 to perform features or functions of the present invention as discussed herein.

The foregoing description and drawings of preferred embodiments in accordance with the present invention are merely illustrative of the principles of the invention. Various modifications can be made to the embodiments by those skilled in the art without departing from the spirit and scope of the invention, which is defined in the appended claims.

The invention claimed is:

1. A method to develop a substrate noise aware floorplan for an integrated circuit design that includes first blocks that are substrate noise sources and second blocks that are sensitive to substrate noise, the method comprising:
    generating digital noise models that indicate respective digital noise model locations within one or more first blocks of the integrated circuit design and that indicate corresponding digital noise model values that represent digital switching induced power supply fluctuations associated with such respective digital noise model locations;
    producing a proposed floorplan for the integrated circuit design that specifies positions of the first and second blocks;
    producing a substrate noise model for the substrate on which the first and second blocks are to be disposed;
    defining one or more noise observation ports associated with one or more second blocks;
    using the floorplan to associate respective digital noise model locations within one or more respective first blocks with respective substrate locations;
    using the floorplan to associate respective noise observation ports with substrate locations adjacent to corresponding second blocks;
    performing a first simulation, using a computer, of substrate noise propagation from at least one respective first block to at least one second block that includes,
        for one or more of multiple respective digital noise models of the respective at least one respective first block,
        using a sub-circuit model associated with the digital noise model to impart a value indicated by the digital noise model to a substrate location associated with the digital noise model location indicated by the digital noise model, and
        using the substrate noise model to propagate noise injected to the substrate by the imparted value from the associated substrate location to at least one noise observation port location;
    performing a second functional simulation of at least one second block using noise propagated to an observation port associated with such second block as noise input for such functional simulation; and
    determining based upon the functional simulation whether such second block experiences a substrate noise level that is not within a noise constraint; and
    if such second block is determined to experiences a substrate noise level that is not within the noise constraint, then changing the floorplan to attempt to bring the substrate noise level experienced by such second block to within the noise constraint.

2. The method of claim 1, wherein changing the floorplan so as to bring the substrate noise level experienced by such second block to within the noise constraint includes:
    moving at least one block to a different location in the floorplan.

3. The method of claim 1, wherein changing the floorplan so as to bring the substrate noise level experienced by such second block to within the noise constraint includes:
    defining at least one guard ring to add to the floorplan.

4. The method of claim 1,
    wherein the respective digital noise model locations within respective first blocks of the integrated circuit design correspond to respective locations of power network contacts within such respective first blocks.

5. The method of claim 1, wherein at least one respective digital noise model location within respective first blocks of the integrated circuit design corresponds to a respective aggregated location that represents an aggregation of locations of multiple power network contacts within such respective first blocks.

6. The method of claim 1,
    wherein at least one respective digital noise model indicates a corresponding digital noise model value that represents an aggregated value that corresponds to digital switching induced power supply fluctuations associated with multiple respective digital noise model locations.

7. The method of claim 6,
    wherein the aggregated value represents a worst case value from among the multiple respective noise model locations.

8. The method of claim 1 further including:
    associating respective digital noise models with respective sub-circuit models that represent electrical coupling between respective substrate locations and respective locations indicated by such associated digital noise models within respective first blocks.

9. The method of claim 8,
    wherein associating include associating at least one sub-circuit model that represents resistive coupling.

10. The method of claim 9,
    wherein associating include associating at least one sub-circuit model that represents RC coupling.

11. The method of claim 1 further including:
    obtaining a hierarchical design for one or more first blocks and for or more second blocks that include respective first partitions that represent the one or more first blocks and one or more second blocks at a first level of abstraction and that include respective second partitions that represent the one or more first blocks and the one or more second blocks at a second level of abstraction;
    wherein generating the digital noise models includes generating using the first partitions that represent the one or more first blocks; and
    wherein producing a floorplan for the integrated circuit design that specifies positions of the first and second blocks includes producing using the second partitions that represent the one or more first blocks and the one or more second blocks at a second level of abstraction.

12. The method of claim 1 further including:
    obtaining a hierarchical design for one or more first blocks and for or more second blocks that include respective first partitions that represent the one or more first blocks and one or more second blocks at a first level of abstraction and that include respective second partitions that represent the one or more first blocks and the one or more second blocks at a second level of abstraction;

wherein generating the digital noise models includes generating using the first partitions that represent the one or more first blocks;

wherein producing a floorplan for the integrated circuit design that specifies positions of the first and second blocks includes producing using the second partitions that represent the one or more first blocks and the one or more second blocks at a second level of abstraction; and wherein the first level of abstraction includes detailed placement and routing information;

wherein the second level of abstraction does not include all of the detailed placement and routing information included in the first level of abstraction.

13. A computer readable storage medium storing computer code to cause a processing device to perform a method to develop a substrate noise aware floorplan for an integrated circuit design that includes first blocks that are substrate noise sources and second blocks that are sensitive to substrate noise, the method comprising:

generating digital noise models that indicate respective digital noise model locations within one or more first blocks of the integrated circuit design and that indicate corresponding digital noise model values that represent digital switching induced power supply fluctuations associated with such respective digital noise model locations;

producing a floorplan for the integrated circuit design that specifies positions of the first and second blocks;

producing a substrate noise model for the substrate on which the first and second blocks are to be disposed;

defining one or more noise observation ports associated with one or more second blocks;

using the floorplan to associate respective digital noise model locations within one or more respective first blocks with respective substrate locations;

using the floorplan to associate respective noise observation ports with substrate locations adjacent to corresponding second blocks;

performing a first simulation, using a computer, of substrate noise propagation from at least one respective first block to at least one second block that includes, for one or more of multiple respective digital noise models associated with the respective at least one first block, using a sub-circuit model associated with the digital noise model to impart a value indicated by the digital noise model to a substrate location associated with the digital noise model location indicated by the digital noise model; and using the substrate noise model to propagate noise injected to the substrate by the imparted value from the associated substrate location to at least one noise observation port location;

performing a second functional simulation of at least one second block using noise propagated to an observation port associated with such second block as noise input for such functional simulation; and determining based upon the functional simulation whether such second block experiences a substrate noise level that is not within a noise constraint; and if such second block is determined to experiences a substrate noise level that is not within the noise constraint, then changing the floorplan to attempt to bring the substrate noise level experienced by such second block to within the noise constraint.

14. A system to develop a substrate noise aware floorplan for an integrated circuit design that includes first blocks that are substrate noise sources and second blocks that are sensitive to substrate noise, the method comprising:

means for generating digital noise models that indicate respective digital noise model locations within one or more first blocks of the integrated circuit design and that indicate corresponding digital noise model values that represent digital switching induced power supply fluctuations associated with such respective digital noise model locations;

means for producing a floorplan for the integrated circuit design that specifies positions of the first and second blocks;

means for producing a substrate noise model for the substrate on which the first and second blocks are to be disposed;

means for defining one or more noise observation ports associated with one or more second blocks;

means for using the floorplan to associate respective digital noise model locations within one or more respective first blocks with respective substrate locations;

means for using the floorplan to associate respective noise observation ports with substrate locations adjacent to corresponding second blocks;

means for performing a first simulation, using a computer, of substrate noise propagation from at least one respective first block to at least one second block that includes, for the one or more of multiple respective digital noise models associated with the respective at least one block, using a sub-circuit model associated with the digital noise model to impart a value indicated by the digital noise model to a substrate location associated with the digital noise model location indicated by the digital noise model; and using the substrate noise model to propagate noise injected to the substrate by the imparted value from the associated substrate location to at least one noise observation port location;

means for performing a second functional simulation of at least one second block using noise propagated to an observation port associated with such second block as noise input for such functional simulation; and means for determining based upon the functional simulation whether such second block experiences a substrate noise level that is not within a noise constraint; and means for changing the floorplan to attempt to bring the substrate noise level experienced by such second block to within the noise constraint if such second block is determined to experiences a substrate noise level that is not within the noise constraint.

* * * * *

UNITED STATES PATENT AND TRADEMARK OFFICE
CERTIFICATE OF CORRECTION

| | |
|---|---|
| PATENT NO. | : 7,865,850 B1 |
| APPLICATION NO. | : 12/037843 |
| DATED | : January 4, 2011 |
| INVENTOR(S) | : William H. Kao et al. |

It is certified that error appears in the above-identified patent and that said Letters Patent is hereby corrected as shown below:

In column 3, line 9, delete "floorpan" and insert -- floorplan --, therefor.

In column 4, line 27, after "for" insert -- one --.

In column 8, line 11, delete "floorpan." and insert -- floorplan. --, therefor.

In column 8, line 33, delete "VotageStorm™," and insert -- VoltageStorm™, --, therefor.

In column 10, line 55, delete "p+drain" and insert -- p+ drain --, therefor.

In column 12, line 41, delete "VotageStorm™" and insert -- VoltageStorm™ --, therefor.

In column 12, line 52, delete "postlayout," and insert -- post layout, --, therefor.

In column 15, line 37, delete "$i_0$," and insert -- $i_0$ --, therefor.

In column 18, line 46, in Claim 11, after "for" insert -- one --.

In column 18, line 62, in Claim 12, after "for" insert -- one --.

Signed and Sealed this
Twenty-fourth Day of May, 2011

David J. Kappos
*Director of the United States Patent and Trademark Office*